United States Patent [19]

Garetti et al.

[11] 4,216,532

[45] Aug. 5, 1980

[54] SELF-CORRECTING SOLID-STATE MASS MEMORY ORGANIZED BY WORDS FOR A STORED-PROGRAM CONTROL SYSTEM

[75] Inventors: Enzo Garetti; Renato Manfreddi, both of Turin, Italy

[73] Assignee: CSELT - Centro Studi e Laboratori Telecomunicazioni S.p.A., Turin, Italy

[21] Appl. No.: 17,037

[22] Filed: Mar. 2, 1979

[30] Foreign Application Priority Data

Mar. 9, 1978 [IT] Italy ................... 67499 A/78

[51] Int. Cl.² ................................................ G11C 13/00
[52] U.S. Cl. ........................ 365/182; 365/189; 365/238; 307/238
[58] Field of Search ............ 365/182, 189, 190, 206, 365/230, 233, 238; 307/238

[56] References Cited

U.S. PATENT DOCUMENTS 3,953,837  4/1976  Cheek, Jr. .................. 365/238

*Primary Examiner*—Terrell W. Fears
*Attorney, Agent, or Firm*—Karl F. Ross

[57] ABSTRACT

A stored-program control system for a telephone exchange or the like comprises processing units coupled to several main memories and to several mass memories. Each mass memory includes one or more memory modules each with one or more rows of shift registers of the charge-coupled type, operating in a serial-parallel-serial mode, and a control module equipped with a self-correcting logic and a microprogrammed time base.

10 Claims, 11 Drawing Figures

SELF-CORRECTING SOLID-STATE MASS MEMORY ORGANIZED BY WORDS FOR A STORED-PROGRAM CONTROL SYSTEM

FIELD OF THE INVENTION

The present invention relates to stored-program control systems for telecommunication apparatuses, and more particularly it concerns a self-correcting solid-state mass memory, making use of the charge-coupled-device (CCD) technology.

BACKGROUND OF THE INVENTION

It is known that present stored-program control systems present memories organized in a hierachic structure, providing fast-access memories for on-line programs and data (main memories), followed by other memories, generally with slower access, for programs and data for less immediate and frequent use (mass memories). These memories often perform also as auxiliary memories for the main memories, that is they contain also semi-permanent data and on-line programs necessary to allow the control system to be put again into the usual service when a failure occurs in the main memories.

Till now mass memories have been usually realized by disk units, magnetic tapes or drums, because, owing to the state of the art, these solutions alone could ensure large storage capacity at reduced cost.

However, magnetic memories present a number of inconveniences:

they can not attain sufficiently high operating speed, chiefly fast access time;

they can not ensure a sufficiently high "system availability" (intended as probability of finding the system operating at any moment), owing to the frequent interventions necessary to maintain the efficiency of the units; this feature is emphasized by the fact that the magnetic units have moving mechanical parts that require an initial running-in and present wear phenomena that can also require preventive maintenance.

For these reasons the studies meant to realize memories of different types mainly for small and middle capacity (for instance up to 10 million words) have proved to be of main importance; owing to the development in the techniques able to realize solid-state components, the studies have been directed towards components of very high-scale integration, and more particularly towards chargecoupled devices.

A memory of this type with operating characteristics very similar to those of a disk unit is already commercially available.

A solid-state memory like this one intrinsically presents high operating speed as well as good reliability and easy-maintenance characteristics; moreover it presents good modularity which is why, to begin with, rather small units may be used that can be increased according to the requirements.

However, this known memory presents a number of inconveniences that make it not so apt to be used in telecommunications systems control: more particularly it provides no error self-correcting possibility and is organized by "btyes", that is by 8-bit words.

But in telecommunications applications the control system must be in service continuously: then it is important for the mass memory to be provided with self-correcting means preventing the system from being put out of service during the time necessary to detect the cause of the error and to remedy same; self-correction provides an efficient protection of the stored data, so that said data do not get lost and can be used by a possible auxiliary unit put into service by a reconfiguration system.

Moreover, for velocity purposes, the system must operate on words of 16 bits at least.

OBJECT OF THE INVENTION

The aim of the present invention is to provide a solid-state mass memory of the above type, that can be utilized in a control system applied to telecommunications, comprises error self-correcting means and is capable of using very long words.

SUMMARY OF THE INVENTION

In accordance with the present invention we provide a mass memory consisting of one or a plurality of units each comprising a certain number of memory modules, a control module and a bidirectional internal bus connecting the control module to the memory modules, in which each memory module comprises:

one or a plurality of rows of integrated circuits realized by charge-coupled technology and consisting of blocks of shift-registers organized in serial-parallel-serial configuration, each block being able to be addressed randomly and at the same time as the blocks of equal position in all the circuits of a row and containing a plurality of cells that can be sequentially addressed, each circuit storing a bit out of a plurality of words consisting of information and redundancy bits, each row comprising as many circuits as there are bits in said words;

input/output means able to connect said circuits to said internal bus; and in which the control module comprises:

a microprogrammed time base designed to generate the timing signals necessary to the operation of the memory unit;

an addressing control circuit that, on the basis of the information received from the controller and from the time base, generates the addresses for reading and writing in the memory modules and memory circuits;

input/output means designed to connect said control module to the internal bus and to distribute the data towards the memory modules or the controller;

a self-correcting logic, able to generate the redundancy bits on the basis of the information bits; able to check, by using said bits, the good operation of the memory-modules and to correct possible memory-errors.

A memory of this type, with self-checking of addressing and timing, allows to considerably simplify the structure and the programming of the interface (controller) which generally is provided between the mass-memory and the processing system; besides, by a suitable choice of the interface, the mass-memory can be considered by the processing as whatever main memory bank.

BRIEF DESCRIPTION OF THE DRAWING

The above and other features of our invention will now be described with reference to the annexed drawing in which.

Specific Description

Figure 1:
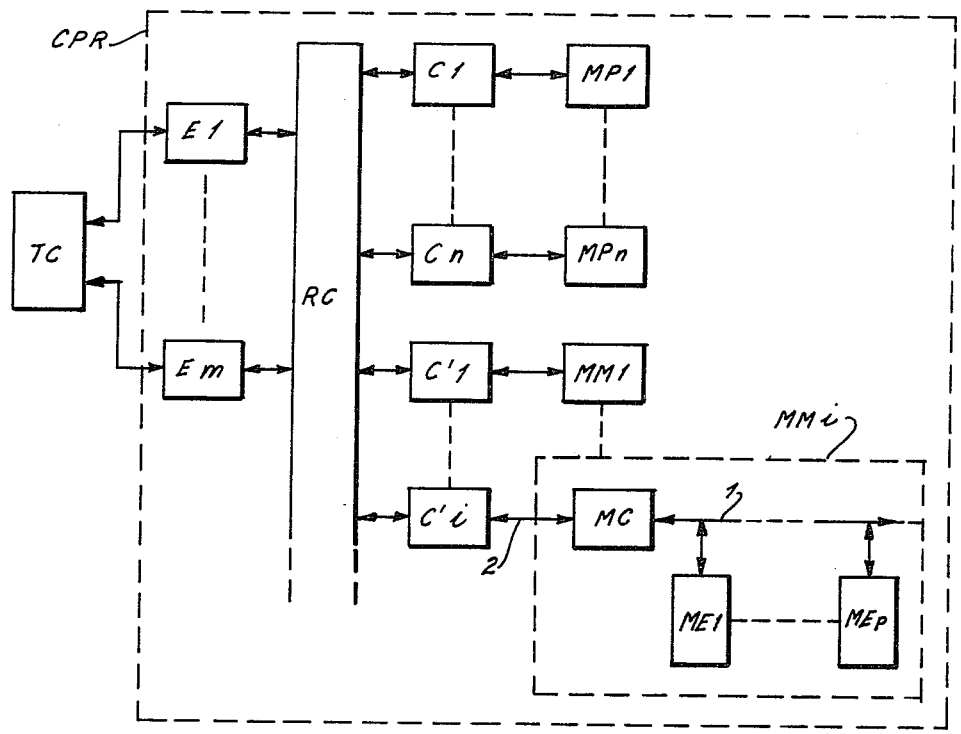
FIG. 1 represents the block diagram of a solid-state mass-memory unit and its interconnections with a "multiprocessor" processing system.

FIG. 1 shows a telecommunication apparatus TC, for instance a telephone exchange, associated with a stored-program control system CPR which by way of example is supposed to be of the "multiprocessor" type.

System CPR comprises: a plurality of processing units E1 ... Em, a plurality of main memory units MP1 ... MPn for on-line data and programs, and a plurality of mass-memory units MM1 ... MMi.

Processing units E are connected with memory units MM, MP through a connection network RC and so-called "controllers" C1 ... Cn, C'1 ... C'i, i.e. devices controlling data transfer between processing units and memory units. More particularly, as the invention relates to a memory organized by words, data transfer towards the memories MM will occur in an asynchronous/parallel way, that is all the bits composing a word will be transferred to the corresponding memory unit in parallel, at the instant where the memory unit requires it. Devices C, C' are well known in the art and, will not be described in further detail.

Every unit MM1 ... MMi of the mass-memory is composed of a plurality of memory modules ME1 ... MEp interconnected with each other as well as with a control module MC through a bus 1.

Memory modules ME are realized by means of integrated circuits using a charge-coupled technology; according to the present invention each circuit can store a bit of a certain number of words consisting of information and redundancy bits that can be used for error-detecting and error-correcting operations.

As the invention is to be applied to telecommunication systems, for reasons of operating speed, the words ought to contain at least 16 information bits; in addition, it has come out that given the correction method (i.e. the use of the so-called Hamming code), the minimum number of redundancy bits ensuring the single error correction on 16 bits is 5 bits. Hereinafter, by way of example reference will be made to words composed of 16 information bits and 5 redundancy bits. Of course the number of redundancy bits can be varied in order to enable the detection and the possible correction of multiple errors.

The structure of modules ME will be described in greater detail with reference to FIG. 2.

Control module MC, which is connected to controller C' through a bus 2, has the task of generating the timing signals necessary to the operation of the memory unit, to provide the correct addressing during the operations, and to supervise the operation of the memory itself by detecting and correcting errors.

As already stated, the self-governing control of the addressing and timing operations allows to simplify the structure and programming of the controller; besides, by a suitable choice of the controller, the mass memory may be seen by the computing system as any main-memory bank. The structure of MC will become clearer from FIG. 3.

Figure 2:
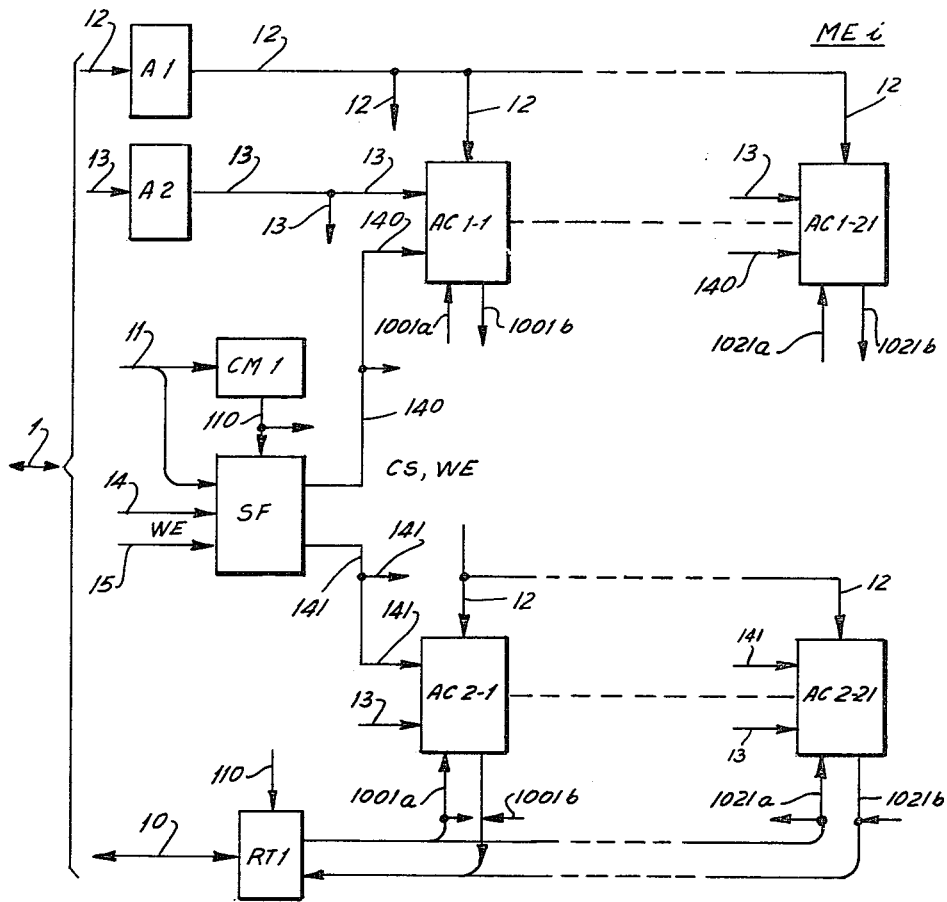
FIG. 2 is a block diagram of a memory module of the memory unit of FIG. 1.

With reference to FIG. 2, a generic memory module MEi comprises a plurality of integrated charge-coupled circuits AC, identical to one another and designed each to store a bit of the words to be loaded into module MEi. The choice of the integrated circuit and the number of circuits AC of a module will depend not only on the number of bits of each word, but also on the required capacity of each module; obviously such a number will depend on construction standards.

By way of example, taking into account the assumption of operating with 21-bit words, we have shown in the drawing two rows of 21 memory circuits, denoted by AC1-1 ... AC 1-21 and AC2-1 ... AC2-21.

Advantageously each integrated circuit AC consists of a plurality of blocks, which can be individually addressed, of shift registers organized in the serial-parallel-serial configuration, that is each block contains an input register loaded in series and unloaded in parallel, a plurality of intermediate registers loaded and unloaded in parallel, and an output register loaded in parallel and unloaded in series. By this arrangement the registers of a block actually behave as a single register, and all the blocks form together a random-access memory.

In these circuits, beginning from a position indicated by the controller, reading, writing or "reading-modifying-writing" operations may be effectuated. The last operation occurs when correcting devices have detected an error to be corrected. In the absence of requests for operation the information will be "refreshed" by recirculating the bits of the information itself.

Inside each block, fast timing signals will control the shifting in series inside a register (more particularly the loading of the input register and the unloading of the output register); slow timing signals will control the transfer in parallel between adjacent registers (more particularly, the unloading of the input register, and the loading of the output register).

According to the present invention these signals, hereinafter referred to as "shift signals" and "transfer signals" respectively, have different period and/or shape depending on the type of operation effectuated and on the working phase within each operation, as described hereinafter. In all the operation phases the ratio between the two types of signals will obviously remain constant.

An example of circuits of this type is the one sold under the name of CCD 464 by the Fairchild Camera and Instrument Corporation of Mountain View (California, USA); this circuit comprises 16 blocks of 128 registers with 32 positions, in which the shifting is controlled by a pair of signals the first of which determines the time allotted to each bit while the second one controls the actual loading or unloading in series. A second pair of signals, having a period 32 times longer, control the transfer in parallel.

For clarity reasons, the following description will be made in the assumption that circuits AC are really circuits CCD 464. Yet, by means of obvious modifications, the invention can be applied to any type of charge-coupled memory circuit organized by blocks of registers available in serial-parallel-serial configuration.

The several circuits AC are connected with a transceiver RT1, of any known type and working as output-/input unit for data. The connection is realized by means of pairs of wires 1001a, 1001b ... 1021a, 1021b; wires a are designed to convey the bits to be written and wires b are designed to convey the read bits.

Transceiver RT1 is connected with the control module through a data bus 10 (FIG. 2) forming part of the internal bus 1 of the memory unit MM. RT1 is enabled by a signal generated by the control module and by the output signal of a comparator CM1 to which it is connected through wire 110. CM1 receives from the control module MC, through a group of wires 11 (forming also part of bus 1), those address bits identifying a module ME, and emits the enabling signal on wire 110 when it recognizes that the address is the one of the module it forms part of.

All circuits AC are connected with control module MC through two other groups of wires, denoted by 12, 13; group 12 conveys the bits allowing to select in all the circuits the same block of registers among the sixteen blocks contained in each circuit, and group 13 conveys the shift and transfer signals. Means A1, A2 will amplify the signals present on such wires so as to make them suitable to control all circuits AC.

From a device SF that selects the row of the circuits AC involved in an operation, all the circuits of a row receive a signal CS that enables the actual addressing and, during the writing, a signal WE enabling the writing. These signals, that arrive at SF from the control module on wires 14, 15 respectively, are preferably conveyed to circuits AC1 and AC2 through separated pairs of wires, here denoted by 140, 141.

This solution has proved preferable for a higher capacity of circuit driving.

The signal denoting the row to be addressed arrives at SF through one of wires 11.

The operation of circuit SF is enabled by the output signal of comparator CM1. Then it may be said that the actual addressing in reading and in writing of each circuit AC is subject to a double enabling, that is, the generic circuit AGh-k of a module MEi can be addressed only if the module and the row of circuits it belongs to (signals on wires 11) are involved in the operation and if addressing-enable signal CS is present. This solution allows to limit to the minimum the consumption of power when a module or a row of circuits are not involved in an operation.

Figure 3:
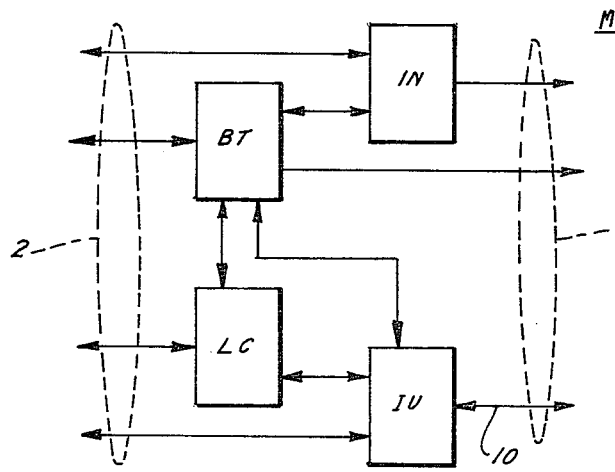
FIG. 3 is a block diagram of the control module of the memory unit of FIG. 1.

With reference to FIG. 3, the control module MC comprises a time base BT, an address control device IN, a unit IU of data input and output and a self-correcting logic LC.

The microprogrammed time base BT is designed to generate timing signals for the corresponding memory unit MM (FIG. 1), including the shift and transfer signals, and to generate together with IN read and write addresses in circuits AC (FIG. 2) of each module ME (FIG. 1). The microprogrammed structure operates so that certain operations occur at a variable speed depending on the operating phases, and this is a fundamental characteristic of the invention.

Input/output unit IU has the task of controlling the operations connected with the asynchronous data exchange between the controller and the memory and to adapt the characteristics of the signals between the controller and the internal bus of the memory.

The self-correcting logic LC is designed to generate redundancy bits, on the basis of the information bits it receives through IU; in case of reading in the memory, LC is also able to compare the bits it generates with the read bits; in case of discrepancy, to correct the information bits and to signal the discrepancy to the controller.

The structure of blocks IN, BI, IU, LC and the interconnections between said blocks will become apparent in greater detail from FIGS. 4 to 7. To simplify the drawing, these Figures schematize with separated connections the connections of each block with the controller, with the memory blocks or with the remaining blocks.

Figure 4:
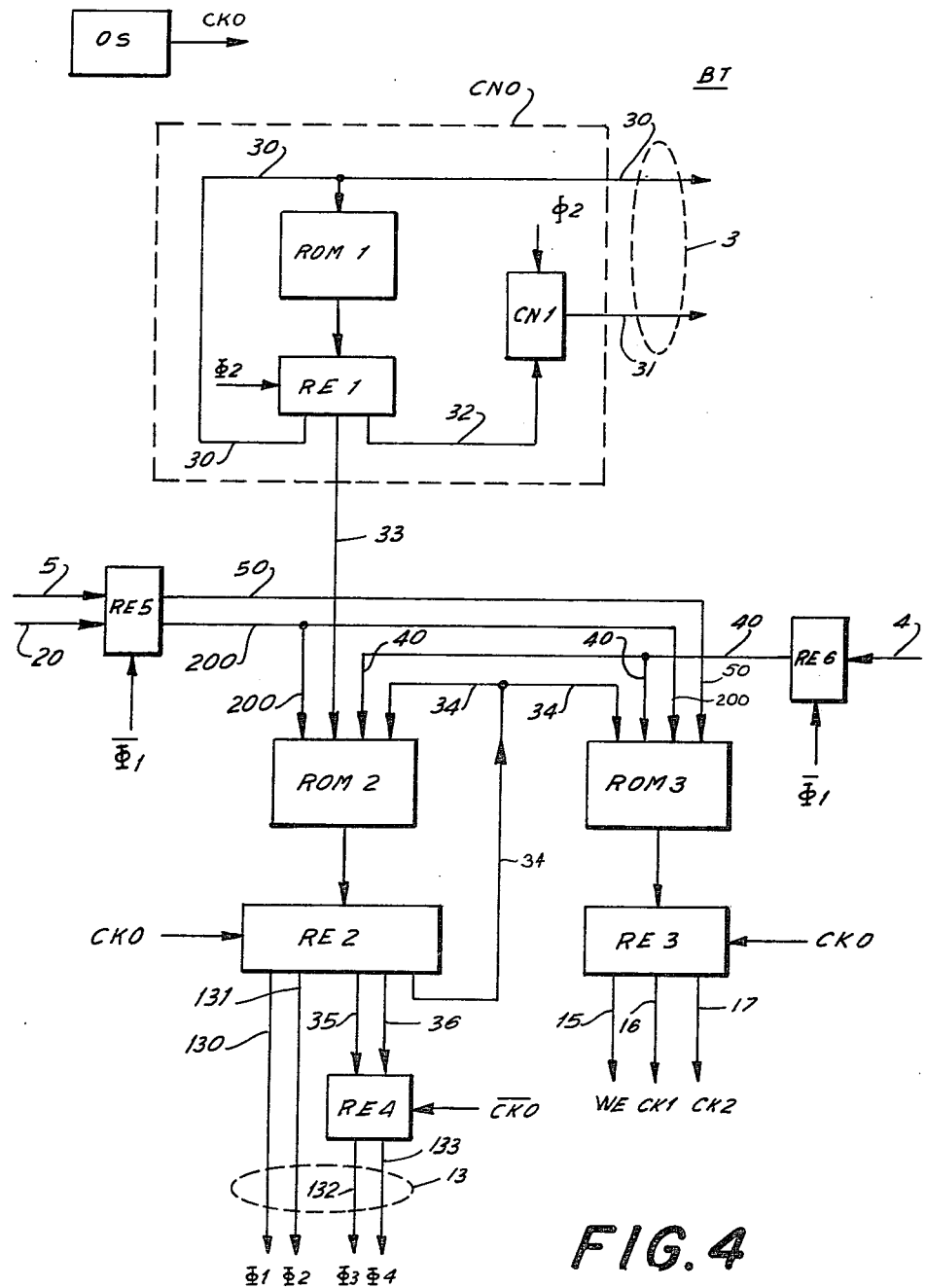
FIG. 4 is a detailed scheme of the time base of the control module of FIG. 3.

With reference to FIG. 4, OS denotes a conventional oscillator, which generates a fundamental clock signal CKO utilized by the time base to obtain other timing signals.

References ROM1, RE1, CN1 denote a read only-memory, a parallel-parallel register and a counter that together form a 4096-step address counter. More particularly, the result of the counting of CNO detects the position of a word inside a block of registers in circuits AC (FIG. 2) as an effect of the shift and transfer signals: at the output 31 of CNO the less significant bits of the complete address will be present.

Counter CNO is subdivided into two 64-step counters one of which, with output decoding, consists of ROM1 and RE1, the other one being CN1.

Memory ROM1, which is addressed by the counting of its internal state, contains 64 words comprising each six bits of internal state (that is six bits indicating the result of the counting module 64), three bits forming a conditioning signal for a second readonly memory ROM2, and 1 bit forming the carry of the counter.

The words of ROM1 are stored and recalled in parallel by RE1 upon command of the shift signal (Φ2) which causes the storage and recall of the bits of the memory: so RE1 stores a new word each time a word must be shifted by a position inside the input or output register of a block of circuits AC (FIG. 2).

The output of RE1 relative to the state bits (wires 30 of connection 3) is carried onto ROM1 as an address signal and, together with wires 31 outgoing of CN1, it transfers to device IN (FIG. 3) the sequential part of the address, to be compared with the same part of the address generated in IN.

The output 32 (FIG. 4), relating to the carry, forms an input of counter CN1 and advances it by a step at each complete reading of ROM1.

The result of the counting effectuated by CN1, which originates the most significant bits of the sequential part of the address, is presented to output 31 upon a command of the same signal Φ2 controlling the loading of bits into RE1. In this way all the bits of the sequential part of the address are present at the same time.

A further output 33 of RE1 transfers to ROM2 three decoding bits of the internal state of ROM1, used for generating transfer signals.

Memory ROM2 forms, with a second parallel-parallel register RE2, a sequential logic with 8 internal states identifying the elementary time inside a cycle, and is designed to generate shift signals and transfer signals. Memory ROM2 contains 512 words comprising each three status bits and four bits relative to each of said signals, and is jointly addressed by the internal state of ROM1, by two bits denoting what type of operation is in progress and by the result of the comparison between the sequential part of the address generated by ROM1 and the one generated by IN (FIG. 3).

The signals denoting the type of operation arrive from the controller through wires 20, register RE5 and wires 200; the comparison signal arrives from IN through wire 4, register RE6 and wire 40.

Registers RE5, RE6 can transfer to the output the signals present at their inputs in response to the trailing edge of Φ1 (denoted by $\overline{\Phi 1}$).

The words stored in ROM2 are stored (and recalled) in a rhythm similar to the one of the fundamental clock CKO. The outputs of RE2 relative to the internal state of ROM2 (wires 34) are used as addressing signals for the memory itself and for a further read-only memory ROM3; the outputs relative to the shift signals Φ1, Φ2 (wires 130, 131) are sent to the circuits AC; the outputs relative to the transfer signals (wires 35, 36) are loaded into a register RE4 designed to determine the exact phase location of the transfer signals with respect to the shift signals. The loading of RE4 is controlled by the trailing edge of the pulses of CKO (signal $\overline{CKO}$) whilst RE2 is controlled by the leading edge.

On the output wires 132, 133 of RE4 (which with wires 130, 131 form connection 13) are present the effective transfer signals Φ3, Φ4.

The use of read-only memories allows to easily obtain the required variability of the period and of the shape of said signals as a function of the type of operation and of the operating phase in each operation.

More particularly, at each read and/or write operation, a fast shift of bits in register blocks can be controlled till the required initial word is reached; after this phase a slower shift will occur (for instance with a double period) for the real transfer of words to the memory or to the computer. In this way a reduced access time is obtained, while the read and/or write mode occurs at a slower rhythm in order to take into account the processor requirements.

As to the shape of the shift and transfer signals, the address of memory ROM2 conditioned by the kind of operation will of cause allow to have at the output a sequence of words such that the bits relative to each of said signals may remain in either logic state as long as required. This will be clearly seen by examining FIGS. 8a–8d.

Read-only memory ROM3 is a combinational logic that, in dependence upon the kind of operation (present on wires 200), of the internal state of memory ROM2 (arriving at ROM3 through wires 34), of the comparison signal coming from IN (FIG. 3) through wires 4, 40 and of two signals denoting the data transfer status (signals coming from input/output unit IU, FIG. 3, through wires 5, register RE5 and wires 50), generates the timing signals different from shift and transfer signals.

ROM3 contains 256 words, each of them comprising the bit originating the writing-enable signals WE and two bits (CK1, CK2) the first of which enables the data transfer towards the controller and the generation of the sequential part of address by means of IN which the second one enables the data transmission to memory modules. In the absence of CK2, data transmission will be enabled by memory modules towards bus 1 (FIG. 1). It is worth noting that bit CK1 can be emitted only if the signals present on wires 50 denote the end of an operation and if address identity between IN and CKO occurs for this cycle.

It has to be remembered that registers RE5, RE6 load the bits present at their inputs in response to the trailing edge of Φ1. In this way, practically at the beginning of a memory cycle the memory knows whether it has to effectuate an operation or it does not whether it must set itself in search phase or whether it must really read and write data.

A parallel-parallel register RE3 timed by CKO provides the correct positioning in time of the signals generated by ROM3 before transferring them to utilization devices through wires 15, 16, 17. Also the shape of WE, CK1, CK2 will be seen from FIGS. 8a–8d.

Figure 5:
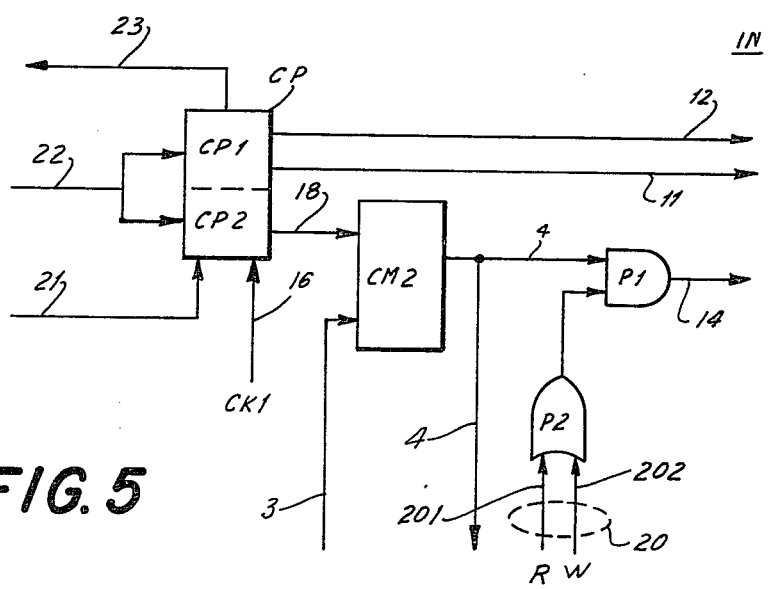
FIG. 5 is a detailed scheme of the device controlling the addresses in the control module of FIG. 3.

In FIG. 5, CP denotes a presettable counter, with a pair of inputs connected to the controller through connection 22 and wire 21, on which there are present the address of the first word involved in an operation and the loading command for such address, respectively. Beginning from such an address, CP sequentially generates the addresses of all the words involved in the operation, and increments its contents at the end of each reading and/or writing operation. The advance command is provided by signal CK1 whose generation, as stated, depends on the ending of a preceeding operation.

CP can be considered as subdivided into two parts CP1, CP2 which receive respectively the most significant part of an address (that is the bits identifying the memory module involved in an operation, the row of memory circuits in the module and the block of shift registers in the circuits of one row) and the least significant part of the same address (that is the bits identifying the word inside a block).

Counter CP is connected to comparator CM1 (FIG. 2) and to amplifier A1 of the memory modules through wires 11, 12 respectively, on which the most significant part of the address (module, row of circuits and block of registers) is present, and to the input of a comparator CM2 (FIG. 6) through wires 18 on which the sequential part of the address is present.

CM2 has a second input connected to connection 3 through which it receives the sequential part of the address generated by the time base.

Wires 18 and the wires of connection 3 will be connected to the inputs of CM2 so as to take into account the speed of the controller, as will be explained later.

In case of equality of the addresses, CM2 generates the comparison signal that through connection 4 is sent both to the time base and to the input of a two-input AND gate P1.

The other input of gate P1 is connected to the output of a two input logic OR gate P2 which receives from the controller, through wires 201, 202 of connection 20, the signals R, W indicating the request for reading and writing, respectively, in the memory. The output of gate P1 is connected through the wire 14 to the input of circuit SF (FIG. 2); the signal present on such a wire is, as already mentioned an enabling signal for the actual addressing of circuits AC.

Figure 6:
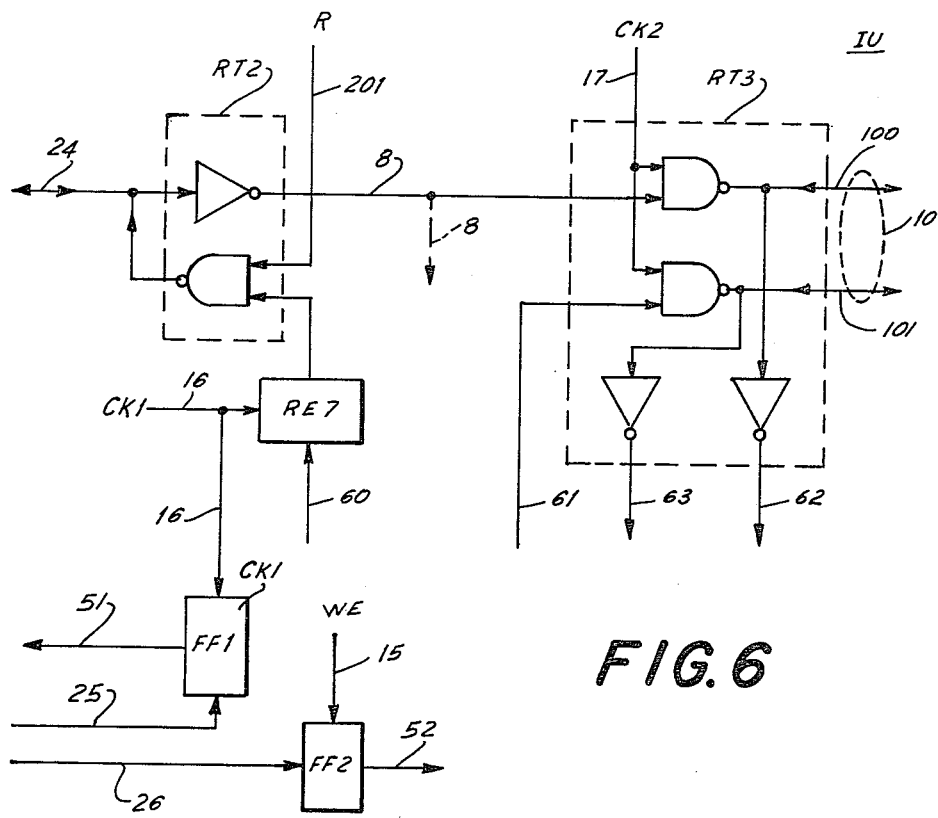
FIG. 6 is a detailed scheme of the input/output unit of said control module.

In FIG. 6, reference RT2 denotes a conventional data transceiver for instance of the type "open collector". To simplify the drawing, a single logic gate for each direction has been shown, but it is evident that RT2 consists of as many pairs of gates as there are wires in connection 24.

In case of data transfer from the controller towards the memory, RT2 receives from C' (FIG. 1) through wires 24 (FIG. 6) the 16 information bits and transfers them via bus 8 towards a second transceiver RT3 and hence to wires 100 of bus 10.

In case of data transfer towards the controller, RT2 sends on wires 24 the information bits, possibly corrected by logic LC (FIG. 3), it receives through wires 60 and a register RE7 timed by signal CK1; in the read-modify-write mode, the same corrected bits may also be transferred to RT3, thus allowing the correction of the memory without intervention of the controller.

The transmission towards the controller is enabled when on wire 201 the signal is present, indicating that a reading phase is in progress.

Transceiver RT3 consists of two units, each realized in the same way as RT2. In case of writing in memory, RT3 transmits on wires 100 the information bits coming from RT2 and on wires 101 the redundancy bits coming from correction logic LC (FIG. 3) through wires 61 (FIG. 6). The transmission is enabled by signal CK2 present on wire 17.

In case of reading in the memory, RT3 transfers towards the correction logic LC (FIG. 3) both the information bits (wires 62) and the redundancy bits (wires 63) so that LC may effectuate check and correction operations.

FF1 denotes a conventional flip-flop controlling the "hand shaking" in reading, between the memory and the controller, that is the dialogue necessary to the correct transfer of the data read in the memory.

Whenever FF1 receives from the time base, through wire 16, a pulse of signal CK1, it emits on wire 51 towards the controller a signal indicating that a datum read in the memory is ready to be transferred to the controller and hence that a reading is in progress; the signal is also sent to memory ROM3 (FIG. 4) of BT.

FF1 is reset to zero when, through wire 25 (FIG. 6), a signal confirming the occurred data acceptance arrives from the controller.

Reference FF2 denotes a second flip-flop, identical to FF1, designed to control the "hand-shaking" in writing between the memory and the controller, that is the dialogue necessary to the correct transfer into the memory of the data supplied by the processor.

Whenever from controller C' (FIG. 1), along wire 26, a signal arrives indicating that the datum is valid, i.e. that it must be really written, FF2 emits on its output 52 a signal indicating that a datum coming from the processor is ready to be transferred into the memory.

In addition, FF2 is reset to zero by the trailing edge of the writing-enable signal WE coming from the time base along wire 15.

The signal present on wire 52 (which with wire 51 forms connection 5 of FIG. 4) is sent both to memory ROM3 of the time-base as "ready datum", and to the controller which thereby is informed if the operation is still in progress or is completed.

Figure 7:
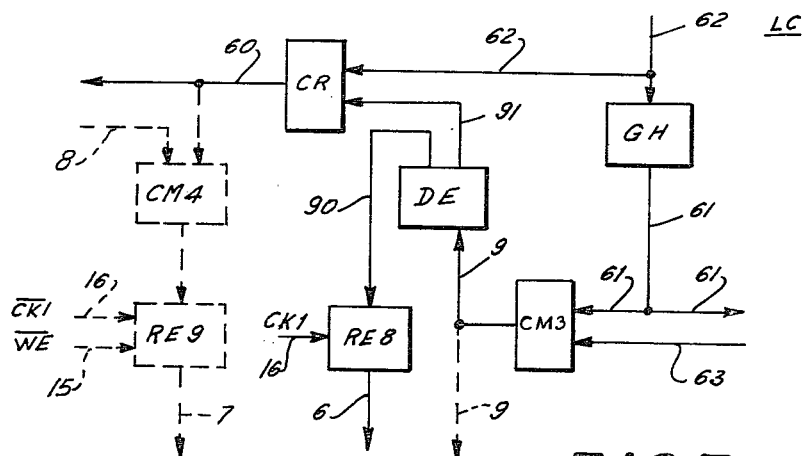
FIG. 7 is a detailed scheme of the correction logic.

FIG. 7 represents by way of example a correction logic exploiting the Hamming code by making use of 5 redundancy bits which, as mentioned, allows the correction of single errors. In the drawing, reference GH denotes the generator of such redundancy bits which advantageously consists of a set of 5 parity generators to which the sixteen wires 62 are duly connected.

Output 61 of GH is connected on the one band to RT3 (FIG. 6) and on the other hand to an input of a comparator CM3 realized for instance by means of exclusive-OR circuits; a second input of CM3 is connected to wires 63 carrying the parity bits read in the memory.

On output 9 of CM3 five bits are present which by their logic value denote whether the bits present on wires 61 and 63 are equal or not; they act, consequently, as an error code. Such an output is connected to an input of a decoder DE which on the basis of the five bits of the error code provides on the output wires 91 sixteen bits whose logic value indicates the possible error of a corresponding information bit. Wires 91 are connected to an input of a correcting device CR, advantageously realized by exclusive-OR circuits, whose second input is connected to wires 62. The output of CR is composed of the wires 60 on which the corrected bits are present.

A further output 90 of DE carries the information on the presence or absence of errors, and is connected to a register RE8 timed by CK1. The output of RE8 is connected to the controller through a wire 6.

The structure just described is sufficient to detect and correct the memory errors. For detecting possible malfunctions of logic LC and of unit IU (FIG. 3), logic LC can comprise a further comparator CM4 (FIG. 7), having an input connected to the output of CR and another one to bus 8. Then CM4 compares the bits corrected by LC to those present on bus 8 after correction. The output of CM4 is connected to a register RE9 activated by the trailing edge of CK1 (denoted by $\overline{CK1}$) or of WE (denoted by $\overline{WE}$); the output of RE9 is connected to the controller.

A further performance of the correction logic LC may be obtained by connecting the output 9 of CM3 to a device that, on the basis of the error code present on wires 9 and denoting what bit of a word is incorrect, and on the basis of the part of address relative to module and row of circuits, allows to detect the memory circuit that originated the error and to send the relative information to the controller.

Obviously, by utilizing a greater number of redundancy bits and/or a code different from the Hamming code, even multiple error can be detected and connected.

The mode of operation of logic LC is as follows.

First considering a reading in the memory, the information bits coming from a memory module on wires 100 (FIG. 6) are sent along wires 62 to generator GH (FIG. 7), whilst the redundancy bits present on wires 101 are sent along wires 63 to CM3 that compares them to those present on wires 61. (It is to be noted that during reading the transmitters of RT3; FIG. 6, are disabled, and so the bits present on wires 61 can not come back to wires 101). Possible errors, recognized as discrepancies between the corresponding bits on the two inputs, are indicated by the presence of one or more 0's on wires 9.

The signals present on wires 9 are sent to DE that, on the basis of the location of the 0's in the output configuration of CM3, identifies the information bits found to be incorrect and emits on wires 91 sixteen bits, each associated to an information bit. In the presence of an incorrect bit, the corresponding bit will have a logic value such as to cause in CR the inversion of the logic value of said incorrect bit and then its correction.

The corrected bits are then sent to the transmitter of RT2 (FIG. 6) and hence to the controller. In the read-modify-write mode of operation, as also the transmitters of RT3 are enabled, the corrected bits presented by RT2 on bus 8 can be transferred on wire 100 and then be sent into the memory.

In the presence of comparator CM4 (FIG. 7), the corrected bits present on wire 60 are compared to those arrived at RT2 (FIG. 6) through RE7 and presented on bus 8, in this way the good operation of RT2 and of bus 8 may be verified. The result of the comparison is sent, as stated, to the controller.

During writing, the information bits coming from the controller still arrive at GH (FIG. 7) through RT2 (FIG. 6), bus 8, RT3 and wires 62, and the redundancy bits generated in GH are sent to the memory via wires 61. As the transmitters of RT2 are disabled, the bits present on wires 60, obtained by comparing the bits transmitted by the controller to those generated by DE on the basis of the bits arriving from CM3 (identical to those generated by GH, as CM3 receives nothing from wires 63, as the transmitters of RT1, FIG. 2, are disabled) can not be transferred to the controller.

If the comparator CM4 is present, the bits present on wires 60 can be compared to those really transmitted by the controller and present on bus 8; a possible discrepancy will point out possible failures in LC; the anomalous situation will be evidenced to the controller through register RE9.

In FIGS. 8a, 8b, 8c, 8d there is represented the behavior of some timing or conditioning signals in the various modes of operation, such as: refreshing, reading, writing, reading-modifying-writing.

The signals that in a certain operation are always at 0 have not been represented for said operation.

As to the output signals from BT, transfer signals have not been represented as they are not germane to the description of the mode of operation.

The shift signal $\Phi 1$ presents a pulse that has always the minimum possible duration permitted by the fundamental clock signal (one period of CK0) and always appears at the beginning of the period of the signal that, as already said, defines the time (cycle) available in the memory for each bit.

Signal $\Phi 2$ presents a pulse delayed with respect to pulse $\Phi 1$ to an extent dependent on the kind of operation, and has the minimal duration with the exception of the read-modify-write operation, where two operations are necessary on the same memory cell.

As to the other signals emitted by BT, WE is obviously active only during the operation phases involving writing in the memory and it presents a pulse with constant deviation but variable positioning; signal CK1 is active during writing, reading, reading-modifying-writing and presents in all these cases a pulse of constant duration and position; signal CK2 is active in the same case as WE and presents a constant-duration pulse such that it overlaps the pulse of WE, whatever its position may be.

In addition, references DPR, DPW denote the signals of "ready datum" in reading and writing present on wires 51, 52 (FIG. 6) which denote, by passing to logic level 0, the completion of an operation; reference A=B denotes the signal whose logic level 1 characterizes the equality between sequential addresses generated by CN0 (FIG. 4) and CP (FIG. 5); reference FL denotes the signal of the end of reading coming from the controller on wire 25 (FIG. 6); reference DV denotes the signal coming from the controller on wire 26 and indicating that a datum to be written is valid.

It will be noted that the signal CK0 is represented only for the refreshment phase.

The mode of operation of the device according to the invention will now be described separately for the four types of possible operations, that is: information refreshment, writing, reading, modifying writing.

For this description reference will be made also to the diagrams of FIGS. 8a–8d supposing, by way of example, that the fundamental clock signal CK0 has a period of 100 ns, and that the shift signals $\Phi 1$, $\Phi 2$ have a period of 400 ns in case of fast shift and of 800 ns in case of low shift.

(1) Refreshement

This phase is controlled by the time base when the memory is in rest conditions, that is no reading nor writing is required by controller C' (FIG. 1).

Under these conditions there is no output signal from gate P1 of IN (FIG. 5) and so all memory circuits AC (FIG. 2) are disabled. In addition also signals WE, CK1, CK2 are at 0, so that transceivers RT1 (FIG. 2), RT2, RT3 (FIG. 6) are not enabled and no bit loading or unloading is possible in circuits AC.

Hence these circuits receive from the control module only the shift and transfer signals, that on this occasion have maximum period.

Under these conditions the bits stored in the registers are recirculated continuously, thus allowing to keep the information.

(2) Reading

A reading operation can be considered as formed of two phases: data search and data transfer.

The first phase begins when controller C' (FIG. 1) activates the reading signal (wire 20, FIG. 4) possibly signaling to the address control device IN (FIG. 3) the address of the first word involved in the operation, and it ends when the time base generates the address at which said word is stored; the second phase begins at that instant and terminates when the transfer is over.

Of course there will be no search phase if the initial address signaled by the controller is the one at which the memory is located.

The following description relates to the most general case in which the reading operation comprises both phases.

Thus, when the controller requests the reading, it can send to CP (FIG. 5) both the initial address and the command for storing such an address, and can send to P2, ROM2 (FIG. 4) and RT2 (FIG. 6) the indication that a reading operation is requested (signal R at 1 on wire 201).

Under this assumption, the address supplied by CP (FIG. 5) is different from the one of CN0 (FIG. 4); the output signal of CM2 (FIG. 5) signals this situation to ROM2 and ROM3 (signal A=B at 0, FIG. 8b) which put themselves in search phase and generate signals $\Phi 1$ to $\Phi 4$, and CK1 with a period and shape typical of this phase. More particularly, $\Phi 1$, $\Phi 2$ have the minimum period and CK1 is at 0 (FIG. 8b).

These conditions are valid till the cyclical counting of CN0 (FIG. 4) generates, as next state of ROM1, the same address that is emitted by CP (FIG. 5). This condition is supposed to occur in coincidence with the second pulse of $\Phi 2$ in FIG. 8b. At the end of the subsequent pulse of $\Phi 1$ (pulse 3) the memories ROM2, ROM3 find address coincidence (signal A=B at 1), no operation in progress (signal DPR at 0) and reading request: consequently, they locate themselves in a state corresponding to the actual reading phase, i.e. $\Phi 1$, $\Phi 2$ recover a maximum period and the pulse of CK1 can be emitted.

As the reading signal is always present on wire 201, transmitter RT2 (FIG. 6) and gate P1 (FIG. 5) are enabled to let through the signals present at their inputs, while the transmitters of RT1 (FIG. 2) are enabled, as CK2 is at 0.

Under these conditions SF receives the signal enabling the reading both in P1 (FIG. 5) and in CM1 (FIG. 2) which previously had already recognized the module to be addressed.

At the subsequent passage to 1 of Φ2 (pulse 3, FIG. 8b) the output registers of a block of circuits of a whole row present at the output the bit stored in their last cell.

Through wires 1001b to 1021b, the transmitters of RT1, wires 100, 101 (FIG. 6) of bus 10, the receivers of RT3 and wires 62, 63, the bits read in the memory are transferred to the correction logic LC (FIGS. 3, 7) for being checked and, if necessary, corrected.

Corrected bits and error signaling, present on wires 60 and on wire 90 respectively, arrive at the input of registers RE7 (FIG. 6) and RE8 (FIG. 7) and, as soon as CK1 passes to value 1, they are presented on wires 220 and 6, respectively. Meanwhile, at the end of pulse 3 of Φ2, counter CN0 (FIG. 4) is advanced by one step and so marks an address different from that of CP (FIG. 5).

When CK1 passes to 1 (FIG. 8b), also counter CP (FIG. 5) advances by one step, and so the addresses are equal again (supposing the comparison occurs between bits of the same weight); besides, DPR (FIG. 8b) passes to 1 and there remains till signal of end of reading FL arrives at FF1 (FIG. 6).

If such a signal arrives before the end of the subsequent pulse of Φ1 (pulse 4), that is if the controller has stored the data within the 400 ns elapsed between the passage to 1 of CK1 and the passage to 0 of Φ1, the same situation occurs that was present at the end of pulse 3, and then the operations are repeated as in the previous cycle for the next word to be read.

Then this procedure goes on unchanged till the controller takes away the read command either because the whole block of words has been read or because CP (FIG. 5) has signaled the end of its counting capacity.

Then the system comes back to the conditions already described for the "refreshment" of the information.

In case controller C' was unable to store the first word within the predicted time the at the end of pulse 4 of Φ1, signal FL has not yet arrived, and so DPR is still at 1, as denoted by the broken line in FIG. 8b. In this situation the emission of CK1 is not enabled, and thus at the arrival of pulse 4 of Φ2, when the time base advances again by one step, address discrepancy between CN0 (FIG. 4) and CP (FIG. 5) will occur. The time base restores itself in search phase till the address identity is found again.

The passage to a search phase can occur either when the signal of end of reading arrives, or as soon as the non-equality of addresses is found. It is evident that in case of very slow control systems, requiring some periods of Φ1 to store a word, the second solution can allow to speed up the operations.

It has to be remembered that, owing to the structure of the memory, the period of Φ1 can not be lengthened beyond a certain limit, that is why it may happen that the control system is unable to store the data within the available time.

It is clear, however, that the data do not get lost because a new operation can not begin if the previous one is not completed (CK1 is at 0 if DPR is not at 0 before the end of the pulse of Φ1).

Under the conditions described above (that is controller unable to accept the data within a period of Φ1) the next address equality can occur only after a time depending on the way the inputs of CM2 (FIG. 5) have been connected to wires 3 and 18. If the connection is such that the bits with equal weight are compared in the two addresses, reading will be possible only after the time base has scanned again the addresses of the 4096 cells of a block. If, on the contrary, the wires are connected so as to compare the bits with different weight in the two addresses, a more frequent reading is possible. For instance, if the controller requires a reading time comprised between 1 and 2 cycles, the least significant bit of the time base can be compared to the most significant one of the word counter; the second bit of the time base can be compared to the least significant one of the counter of words, the third bit of the time base can be compared to the second bit of the counter and so on; in this way there is address equality every two cycles and so the optimization of transfer speed. Analogous procedure can be followed in the cases where the controller requires for instance 4, 8 . . . cycles per reading; then it will be enough to shift the wires by two, three positions.

(3) Writing

The writing operations are basically carried out by following the procedures adopted for reading operations, that is when from C' (FIG. 1) the write command arrives, the search of the first address begins, and then the actual data transfer. The search phase is identical to the reading phase, with the only exception that the enabling signal for gate P1 (FIG. 5) of IN arrives along wire 202 and not along wire 201. When the addresses have been equal (for instance again during the second cycle of Φ1), at the end of the subsequent pulse of Φ1, DPW is at 1 (supposing the controller has furnished the first character to be written at the moment of the writing request), signal A=B is at 1 and obviously the signal of writing request (not shown) is at 1. Under these conditions, ROM2, ROM3 dispose themselves in the state corresponding to writing, wherein, as stated, WE and CK2 will be active and the pulse of Φ2 is slightly more delayed with respect to the one of Φ1 than happened during reading (for instance 200 ns instead of 100) in order to allow a better matching of the operation in the cycle.

At the passage to 1 of CK2, transmitter RT3 (FIG. 6) is enabled to let through the bits present on bus 8 and to transfer them on wires 100 towards transceiver RT1 (FIG. 2) of the memory module which presents them on wires 1001a to 1021a. From wires 100 (FIG. 6) the information bits are transferred also along wires 62 to the correction logic that generates parity bits and transmits them to RT3 which, in turn, presents them on wires 101 (FIG. 6) and sends them to memory module. The next passage to 1 of WE and of Φ2 enables the input registers of circuits AC (FIG. 2) to actually store the bits arriving on wires 1001a to 1021a, and in addition advances CN0 (FIG. 4) by one step.

At the passage to 1, of WE, signal DPW is put to 0 so that the controller may be ready for the subsequent operation. In addition, if logic LC (FIG. 3) comprises comparator CM4 (FIG. 7) and register RE8, the possible presence of malfunctions in the transceivers and in the bus of IU or in the logic itself is signaled to the controller.

At the passage of 0 of WE, signal CK1 passes to 1, thus advancing by one step counter CP (FIG. 5): address equality is again reached. If, before the end of the cycle, the new signal of valid datum DV (FIG. 8c), which restores to 1 signal DPW, arrives at the controller, the conditions necessary for writing are again reached; writing will take place during the subsequent cycle following the same procedure.

If the signal of valid datum does not arrive before the beginning of the cycle during which the writing operation is to be carried out (for instance with reference to FIG. 8c, before the beginning of the cycle identified by pulse 4 of Φ1), at the arrival of such a pulse, DPW would be at 0. Under these conditions (denoted by a broken line in FIG. 8c), signal WE remains at 0 so that the operation is not carried out; as a consequence CK1 remains at 0, CP (FIG. 5) is not advanced, and at the subsequent cycle the addresses generated by CN0 (FIG. 4) and CP (FIG. 5) (supposing the comparison occurs between bits with equal weight) will be unequal, thus preventing again operations from being carried out. Also in this case, the above mentioned considerations related to reading operations for connecting the wires of connections 3 and 18 (FIG. 5) with the inputs of CM2 remain valid.

Obviously, if DV does not arrive even after a delay, the memory enters the refreshing state. Such situation is not represented in FIG. 8c.

(4) Reading-modifying-writing

This type of operation allows to write again in the memory the data corrected in the correction logic; the relative information is supplied to the time base by the contemporaneous presence of signals R, W.

In this type of operation Φ1, Φ2 are at maximum period (FIG. 8d); Φ2 passes to 1 as for the reading but it remains at 1 till about the end of the cycle (for instance 100 ns before the end). In this way the memory is preset to carry out two operations in the same cell. Signal CK1 has still the same behavior as described for reading and writing.

Signal WE passes to 1 shortly after CK1 (for instance after 100 ns) and remains at 1 till the end of the cycle. Signal CK2 will be superimposed on WE as for the writting and passes to 1 with CK1, coming back to 0 at the end of pulse Φ1 of the subsequent cycle.

In this kind of operation, while Φ2 is at 1, both signal CK1 and signal WE (and then CK2) are at 1 for a certain time; consequently the data can be transferred both to the controller and to the memory; more particularly, the corrected data supplied by the correction logic through wires 60 are presented by RE7 both on wires 24 and on bus 8 (as in reading) and in addition can pass from that bus onto wires 100 and 61 (as in writing) and can be sent both to ME and to the correction logic in order to generate redundancy bits.

Figure 8A:
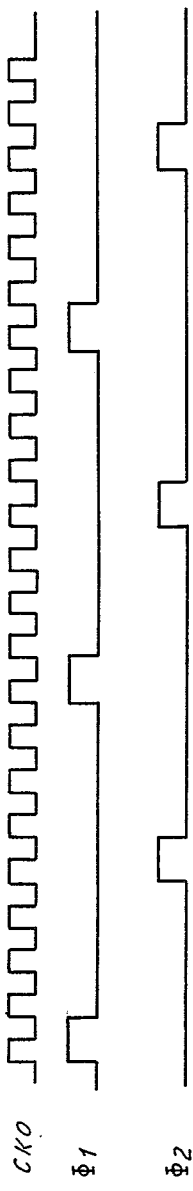
FIGS. 8a–8d show the behavior of some signals controlling the operations in the memory, under different operating conditions.
Figure 8D:
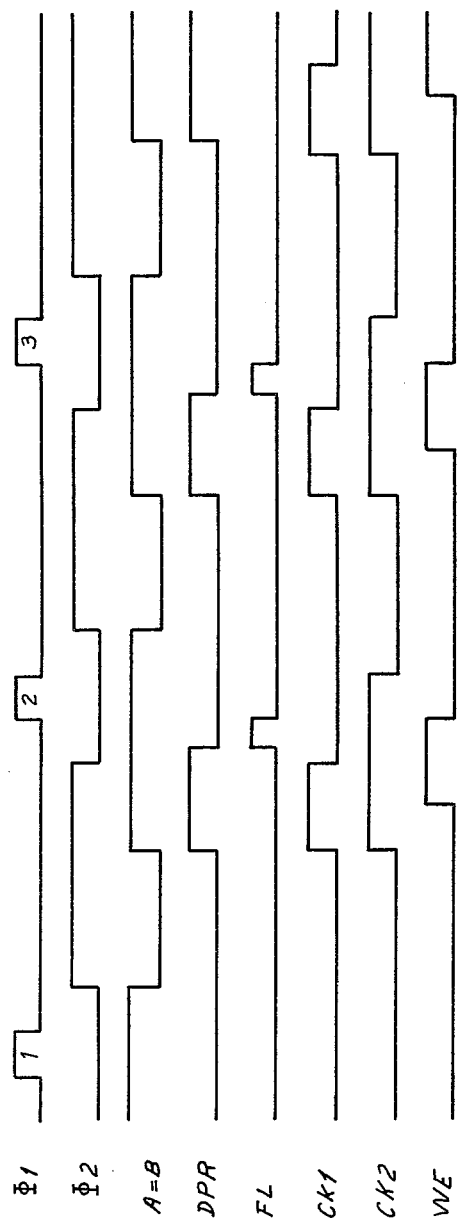
Figure 8B:
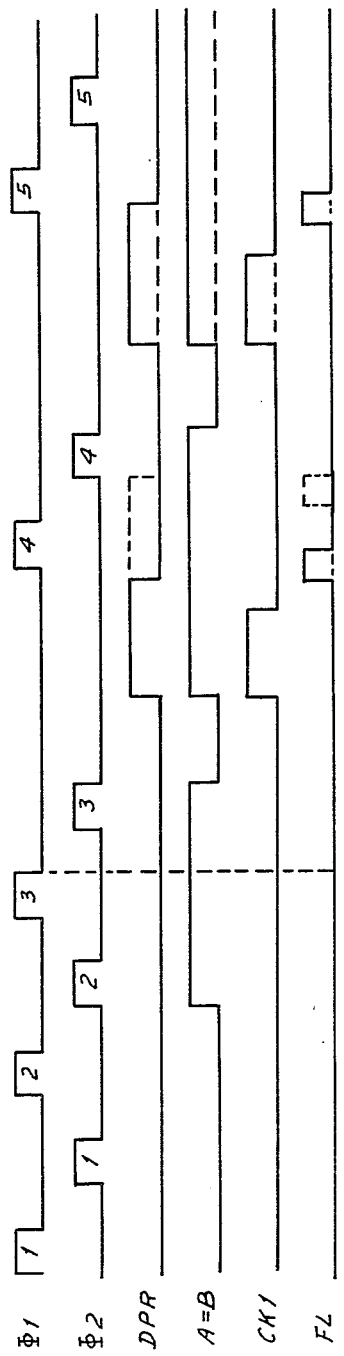
Figure 8C:
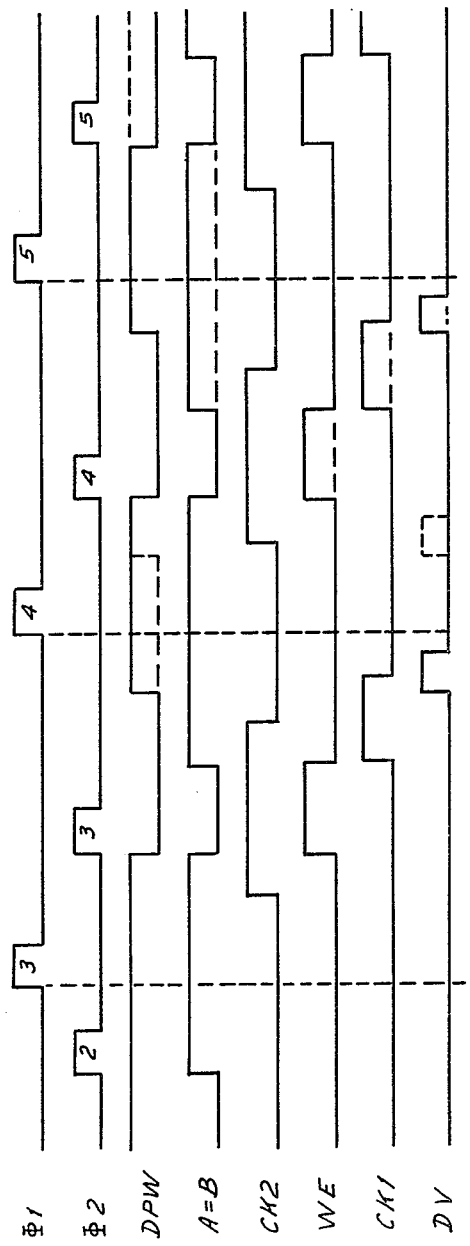

In this type of operation, as shown in FIG. 8d, the dialogue on the controller side appears to be slaved only to the ready datum in reading (DPR) and to the end-of-reading signal FL, while signals DPW and DV are disregarded and hence not represented.

Obviously the considerations already applied for reading and writing may be applied also to this case, if the controller is slow with respect to the memory.

What we claim is:

1. A self-correcting, solid-state mass memory, organized in words for a stored-program control system wherein a processor is interfaced towards the mass memory through a controller, said mass memory including at least one memory module, a control module and a bidirectional internal bus connecting the control module to each memory module, said memory module comprising:

at least one row of integrated memory circuits realized by charge-coupled technology and consisting of blocks of shift registers organized in serial-parallel-serial configuration, each block being able to be addressed randomly and at the same time as the blocks of equal position in all the circuits of the row and containing a plurality of cells that can be sequentially addressed, each circuit storing a bit out of a plurality of words consisting of information and redundancy bits, each row comprising as many circuits as there are bits in said words; and first input/output means able to connect said circuits to said internal bus;

the control module comprising:

a microprogrammed time base designed to generate the timing and enabling signals necessary to the operation of the memory unit, such signals having variable shape and period depending on the type of operation;

an addressing control circuit that, on the basis of the information received from the controller and from the time base, generates the addresses for reading and writing in the memory module and memory circuits;

second input/output means designed to connect said control module to the internal bus and distribute the data towards the memory module or towards the controller; and a self-correcting logic able to generate the redundancy bits on the basis of the information bits and to control, by using said redundancy bits, the good operation of the memory module and to correct possible memory errors.

2. A mass memory according to claim 1 wherein said first input/output means comprise:

enabling means connected on the one hand to said time base and to said addressing control circuit and on the other hand to all memory circuits of the memory module, and able to send to each memory circuit row an addressing-enable signal and a writing-enable signal;

a transceiver able to receive from said second input/output means and to transfer to said memory circuits the data to be written, and to transmit to said control module the data read in the memory module;

a comparator having an input connected to said addressing control circuit and an output connected both to said enabling means and to the transceiver, said comparator being able to start the enabling means and the transceiver when identity is found between a module address sent by the addressing control circuit and an internally wired module address; and amplifying means connected to said addressing control circuit and to the time base, respectively, able to raise the sequential addressing signals to a level sufficient for driving all the circuits of the memory module.

3. A mass memory according to claim 1 wherein said time base comprises:

an oscillator able to generate a fundamental clock signal;

counting means able to generate the sequential part of the word address;

a microprogrammed sequential logic, generating the actual signals of shift in series and of transfer in parallel of the bits inside said blocks of registers, said logic consisting of a first read-only memory and of a parallel-to-parallel register, said first readonly memory being addressed jointly by its internal state, by signals denoting the type of operation in progress and the coincidence of the sequential addresses generated by said counting means and by the addressing control circuit, and by a decoding of the output signals from said counting means relative to the transfer in parallel of the bits between the registers of said blocks, and being read in a rhythm equal to that of said fundamental clock signal;

a second read-only memory that, according to the type of operation, to the internal state of said sequential logic, to said signal of coincidence of the sequential addresses, and to the data-transfer control signals to and from the controller, generates the writing-enable signal, another clock signal controlling the progressing of the sequential address counting in said addressing control circuit and the data transfer to the controller, and a further clock signal enabling the data transfer towards said memory circuits, said second read-only memory being read in a rhythm equal to that of the fundamental clock signal; and registers for rephasing the input and output signals of said sequential logic and of said second memory.

4. A mass memory according to claim 3 wherein said counting means comprises a second microprogrammed sequential logic with decoding and counting functions of the least significant bits of the sequential addresses, and a counter that is advanced by an output signal of said second logic and counts the most significant bits of the sequential addresses.

5. A mass memory according to claim 4 wherein said addressing control circuit comprises:
- a presettable counter that receives from the controller the initial address of a block of words and a loading command for said address and that advances by a step at each read and/or write operation in the memory circuits;
- a comparator with an input connected to an output of said presettable counter on which the sequential part of the address is present, and with another input connected to the output of said counting means and able to signal the concordance between the addresses present at its inputs; and
- logic gates able to transfer the output signal of said comparator to the memory module only when a request for operation is present.

6. A mass memory according to claim 5 wherein the connections to said comparator from said presettable counter and from said counting means are such that bits having equal weight in the addresses respectively generated thereby are compared.

7. A mass memory according to claim 5 wherein the connections to said comparator from said presettable counter and from said counting means are such that a bit of a certain weight in the address furnished by the time base is compared with a bit of the address of said presettable counter whose weight is shifted by n binary positions, so that address equality occurs only every $2^n$ counting steps of the time base.

8. A mass memory according to claim 2 wherein said second input/output means comprise:
- a second transceiver able to receive from the controller, through a first bidirectional bus, the signals to be sent to the memory module and from the self-correcting logic corrected data read in the memory module, said second transceiver being enabled to send the signals thus received onto said first bus only in the presence of a request for reading;
- a third transceiver able to receive from the memory module, through a second bidirectional bus, the read data and to send them to the self-correcting logic, and to receive from said second transceiver the data to be stored, said third transceiver being able to transfer the received data onto said second bus only in the presence of a request for writing;
- a register able to store the corrected data in the presence of an enabling signal coming from the time base; and
- flip-flop means able to control the dialogue between said control module and the controller.

9. A mass memory according to claim 8 wherein said self-correcting logic comprises:
- a generator of redundancy bits connected to said second and third transceivers;
- another comparator having inputs connected to said generator and to said third transceiver, to compare the redundancy bits generated by said generator with those read in the memory circuits, and able to supply an error code that detects the incorrect bit or bits in a word;
- a decoder with the input connected to the output of said other comparator, able to extract from the error code correction signals for the incorrect bit or bits, and to send to the controller the information relative to the presence of error; and
- a correcting device connected to an output of said decoder and able to invert the logic value of the incorrect bit or bits.

10. A mass memory according to claim 9 wherein said self-correcting logic comprises also a further comparator conneced to said correcting device and to said second input/output means, able to compare the bits issuing from said correcting device with those arriving from the controller or with those sent by the second transceiver towards the controller.

* * * * *